United States Patent [19]

Haan et al.

[11] Patent Number: 4,875,285
[45] Date of Patent: Oct. 24, 1989

[54] APPARATUS AND METHOD FOR EQUIPPING PRINTED CIRCUIT BOARDS WITH COMPONENTS

[75] Inventors: Franz Haan, Bruchsal; Lothar Hock, Berlin, both of Fed. Rep. of Germany

[73] Assignee: Siemens Aktiengesellschaft, Berlin and Munich, Fed. Rep. of Germany

[21] Appl. No.: 269,359

[22] Filed: Nov. 10, 1988

[30] Foreign Application Priority Data

Nov. 10, 1987 [DE] Fed. Rep. of Germany ....... 3738152

[51] Int. Cl.$^4$ .......................... H05K 3/30; B23P 19/00
[52] U.S. Cl. ....................................... 29/832; 29/740; 29/759
[58] Field of Search ................ 29/740, 741, 832, 830, 29/759

[56] References Cited

U.S. PATENT DOCUMENTS

| | | |
|---|---|---|
| 3,958,740 | 5/1976 | Dixon . |
| 4,372,802 | 2/1983 | Harigane et al. ................. 29/740 X |
| 4,458,412 | 7/1984 | Dean et al. ........................ 29/740 X |
| 4,520,557 | 6/1985 | Harigane et al. ...................... 29/740 |
| 4,573,261 | 3/1986 | Honda et al. . |
| 4,631,816 | 12/1986 | Fujita et al. ........................ 29/741 X |
| 4,653,664 | 3/1987 | Hineno et al. . |
| 4,706,379 | 11/1987 | Seno et al. ............................. 29/740 |
| 4,763,405 | 8/1988 | Morita et al. ........................... 29/740 |

FOREIGN PATENT DOCUMENTS

| | | | |
|---|---|---|---|
| 65604 | 12/1982 | European Pat. Off. .............. | 29/740 |
| 3424323 | 1/1985 | Fed. Rep. of Germany . | |
| 3532500 | 8/1986 | Fed. Rep. of Germany . | |
| 2108015 | 5/1983 | United Kingdom . | |
| 2166372 | 5/1986 | United Kingdom . | |
| 2140716 | 12/1989 | United Kingdom .................. | 29/740 |

Primary Examiner—Howard N. Goldberg
Assistant Examiner—Carl J. Arbes
Attorney, Agent, or Firm—Hill, Van Santen, Steadman & Simpson

[57] ABSTRACT

An automatic SMD equipping unit utilizes a rotatable and displaceable multiple equipping head (1) with plural suction pipettes (2) and a device carrier (7) that contains processing stations (8). The multiple equipping head (1) executes a collecting event via delivery units (4) whereby it picks up components. The equipping of the printed circuit board (5) from the equipping head occurs in a second procedure, whereby the multiple equipping head (1) need not move back and forth between delivery unit (4) and printed circuit board (5) after every placement of a component (3) onto the printed circuit board (5). The components that were picked up by the suction pipettes (2) are processed by processing stations (8) after the collecting and before the equipping. Here, the components are centered, contacted, measured and tested.

7 Claims, 2 Drawing Sheets

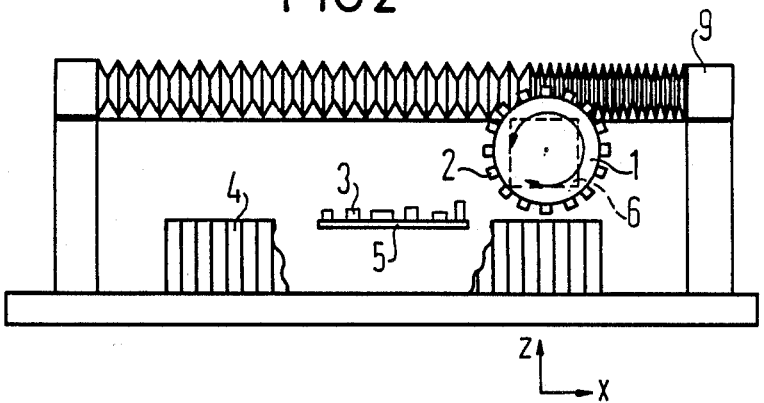
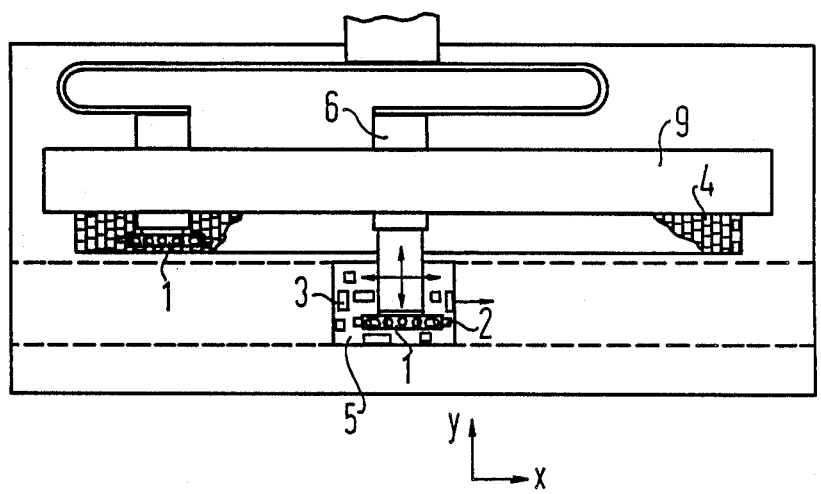

APPARATUS AND METHOD FOR EQUIPPING PRINTED CIRCUIT BOARDS WITH COMPONENTS

The invention is directed to an apparatus and method for equipping printed circuit boards with SMD components and more particularly to the associated appertaining automatic equipping units.

BACKGROUND OF THE INVENTION

What are referred to as automatic equipping units are utilized for fast equipping of printed circuit boards with electrical components. Time-savings in various processing procedures that are desired in this area have led to what is referred to as the SMD technique (surface mounted device). Automatic equipping units that usually work based on the "pick-and-place" method are offered by various manufacturers for the equipping of printed circuit boards, and such units are already very advantageous and compact. In operation, components are individually picked up, centered and positioned, and are individually put in place onto the printed circuit board. Such an operation is executed for each and every individual component.

Other devices that are commercially available already comprise a multiple head that picks components up individually in a sequence and respectively individually places them at a location on the printed circuit board. This requires that the printed circuit board be positioned for every component.

A further apparatus of the prior art functions such that a plurality of components can be picked up but are individually placed on the printed circuit board. The printed circuit board is individually positioned in one planar coordinate direction for every component part, whereas the alignment with respect to the second planar coordinate direction is carried out by the carrier of the component.

These known automatic equipping units, and their appertaining methods require extremely long times due to the conveying paths from a delivery unit to the printed circuit board and back again for every component. The utilization of multiple heads likewise involves no significant time-saving since the printed circuit board must be moved and positioned for the placement of each and every component. Further, the advantages of a multiple head are not completely exploited, since the component parts are picked up in sequences and, thus, a defined sequence must always be observed.

SUMMARY OF THE INVENTION

The object of the invention is to offer an apparatus and a method for equipping printed circuit boards with components, whereby a significantly faster equipping of printed circuit boards is enabled, with simultaneous alignment and checking of the components for correct mounting and functionability, via multiple pick-up of components from delivery units.

This object is achieved by the apparatus and method of the present invention.

The invention is based on the recognition that a significant time-saving in the processing procedures within an automatic SMD equipping unit can only be achieved by utilization of a multiple equipping head, whereby a device carrier is secured to the multiple equipping head, this device carrier seeing to centering, contacting, measurement and, for example, to elimination of non-functioning components by means of processing stations, so that other components simultaneously situated at the multiple equipping head can be simultaneously processed to be ready for mounting during the equipping of the printed circuit board with a specific component part. The device carrier is rigidly connected to the mount of the rotatable multiple equipping head, so that the multiple equipping head can move relative to the device carrier. Both apparatus parts are displaceable in X, Y direction on a carriage, so that neither the delivery units nor the printed circuit boards need be moved for the pick-up of components from specific delivery units or for the equipping of the printed circuit boards with components. This has the special advantage that, compared to a "pick-and-place" device, movement of the equipping head from the delivery units to the printed circuit board and back is not needed between respectively two components. Moreover, an apparatus of the invention can collect components independently of any sequence and can place these components on the printed circuit board in exact positions just as independently of a defined sequence.

An advantageous development of the invention provides that two multiple equipping heads that are located side-by-side and which are individually displaceable on a common stand, alternately execute the operation of collecting and the operation of equipping. This reduces the times required for the conveying paths between a delivery unit and printed circuit board.

An advantageous modification of the invention comprises an arrangement wherein at least two multiple equipping heads that lie opposite one another, and which are displaceable on different stands, equip a printed circuit board situated in the middle with components from delivery units respectively provided for the corresponding multiple equipping heads. An advantage of this embodiment is that a greater freedom for the movement in X-direction is present for every multiple equipping head, in contrast to the movement possibilities of two multiple equipping heads situated on one stand.

The method of the invention provides that an optional collecting of components, and subsequent equipping of the printed circuit board with these components, occurs from or, respectively, on stationary delivery units and printed circuit boards. This has the special advantage that, first, sequences of components are in fact possible but are not necessary in every instance and, thus, need not be observed. Further, the offering of components can be significantly simplified with the stationary delivery units because a replacement of such stationary units can be undertaken in a simple way. The alignment of a component with respect to its place of integration on the printed circuit board occurs above the stationary printed circuit board by displacing the multiple equipping head in X and Y directions on a carriage. This has the advantage that only one side must be aligned since the printed circuit board is stationary.

A particular development of the invention enables the components offered in the delivery units to be supplied without prior testing and reproducible positioning. After a multiple equipping head collects components from delivery units, clocked passage of the individual components situated at the multiple equipping head past the processing stations during collecting or, respectively, during subsequent equipping sees to it that the components are centered, contacted, electrically, optically or mechanically measured, and rejected in case of non-functionality.

Given employment of only one apparatus for equipping printed circuit boards with components, i.e. of a multiple equipping head, it is meaningful to simultaneously execute the collecting of components and the change of printed circuit boards in order to save time.

A further, significant acceleration of the overall method can be achieved by utilizing a coding of the components, so that these can be identified at every location of the apparatus, this acceleration being achieved given the assistance of cameras via which the coding is recognized.

When the apparatus of the invention is combined with a freely programmable control, then it is possible to control and to monitor the individual method steps, such as the simultaneous working of a plurality of multiple equipping heads, utilization of different sizes of different suction pipettes, allocation of specific delivery units to the current location of a component taken therefrom and the designation location of the component on the printed circuit board, as well as positioning of the multiple equipping head with the correspondingly positioned components relative to the printed circuit board and placement of components that have been aligned and checked for mounting on the printed circuit boards.

BRIEF DESCRIPTION OF THE DRAWINGS

An exemplary embodiment shall be set forth below with reference to schematic drawings.

FIG. 2 shows an apparatus comprising a multiple equipping head displaceable via the carriage at the stand and its relative position relative to the delivery units and the printed circuit board;

FIG. 3 shows an apparatus in accord with FIG. 2 shown in plan view;

DESCRIPTION OF THE PREFERRED EMBODIMENT

Figure 1:
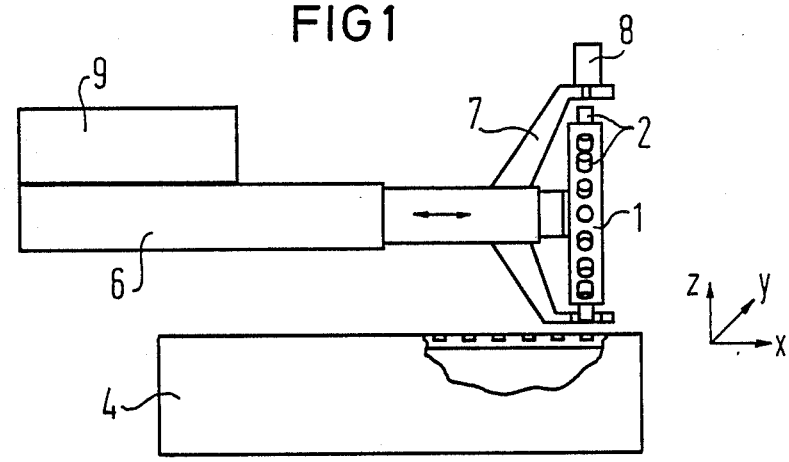
FIG. 1 shows a side elevation view of an apparatus of the invention comprising a multiple equipping head and an associated device carrier.
Figure 4:
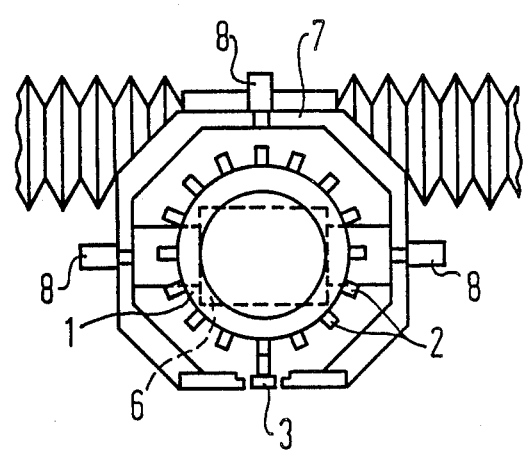
FIG. 4 shows the apparatus of FIG. 1 in a front view.

FIGS. 1 and 4 show views of the rotatable equipping head 1 comprising suction pipettes 2 uniformly distributed thereon, that are extensible for picking up or putting down a component 3, and also shows the device carrier 7 with the processing stations 8 secured thereon. This unit is displaceable in X, Y direction on a carriage 6 that is secured to a stand 9. Further, a delivery unit 4 that, for example, supplies components via a pocket belt is shown. The multiple equipping head 1 can optionally take components of different sizes and different alignments from a plurality of delivery units 4 lying in succession, taking them via the suction pipettes 2 that can also have different sizes. The multiple equipping head can execute the collecting operation, via the suction pipettes 2 and carried to various processing stations 8, located around the periphery of the equipping head. The multiple equipping head is rotated until a component reaches a given processing station, where it is processed, whereby a centering, contacting, and testing of the picked-up components 3 can be subsequently undertaken with the processing stations 8 by rotating the multiple equipping head 1 in an arbitrary direction, until a component 3 lies adjacent a particular processing station 8. The multiple equipping head 1 that is shown here as star-shaped can likewise be circularly or conically constructed. A circular fashioning would mean that the suction pipettes are likewise distributed on the circumference of the multiple equipping head but are oriented parallel to the rotational axis of the multiple equipping head. A conical design has the pipettes oriented such as to form a cone having its apex aligned with the axis of rotation of the head 1, which is inclined so that one of the pipettes is vertical. The axis of the cone may be inclined by 45°, for example, whereby the respective suction pipette pointing perpendicularly down can pick up or place a component. In these various embodiments, care must be exercised to see that the processing stations 8 are positioned such within the device carrier 7 that they respectively come to lie opposite a suction pipette 2 having a component 3 and, correspondingly, can execute a processing step, such as centering, measuring, etc.

FIG. 2 shows a front view of an arrangement of the invention, whereby the carriage 6 is indicated by the broken line. The carriage 6 is suspended displaceable in X-direction on the stand 9 with movable parts that are covered by an accordion bellows. In this case, the displaceability of the multiple equipping head 1 in the Y-direction is in the direction perpendicular to the plane of the drawing. A printed circuit board 5 that is to be provided with components 3 of different sizes and in different positions is indicated. In this embodiment which contains only one multiple equipping head, the collecting event and the equipping event are undertaken by this one multiple equipping head. The rotary direction of the multiple equipping head 1 that is indicated by arrows is thereby correspondingly driveable by the freely programmable control. Due to the coding of the components 3, a specific component that is picked up by a suction pipette 2 can be allocated to its intended position on the printed circuit board 5, and can also be allocated to one or more of the various processing stations 8 (shown in FIGS. 1 and 2).

FIG. 3 shows an arrangement of the invention in which two carriages 6 having corresponding multiple equipping heads 1 are displaceable on a common stand 9. It is indicated that one multiple equipping head 1 executes the optional collecting of components from delivery units 4, and the other multiple equipping head 1 simultaneously executes the equipping of the printed circuit board 5. The possible moving directions of the multiple equipping head 1 are again indicated by arrows; the printed circuit board 5 will usually be conducted past the apparatus in one direction but is stationary at the point in time of equipping.

FIG. 4 shows the front view of a multiple equipping head 1 comprising associated device carriers 7 with three processing stations 8, with suction pipettes 2 and with a component 3. The annular design of the device carrier 7, in the form of an octagon, enables a total of 7 processing stations 8 to be incorporated. A multitude of processing stations 8 can be utilized, if desired, by increasing the number of processing stations arranged on the carrier 7, but this plurality can maximally correspond to the plurality of suction pipettes 2 that are present on the multiple equipping head 1. Moreover, the position of a suction pipette which is directed perpendicularly down in order to place a component that has been readied for mounting, does not have a processing station 8.

In a fashion similar to that indicated in FIG. 3, an apparatus of the invention can be composed not only of two multiple equipping heads 1 that are displaceable side-by-side but can also be composed of two multiple equipping heads 1 that are displaceable on two different stands and which service the same printed circuit board 5 in alternation.

It should be noted, of course, that a multiple equipping head 1 can also only pick up individual components 3. The multiple equipping head need not be completely filled, this being a further advantage of the procedure without forming sequences.

The processing times at an automatic SMD equipping unit can be shortened by 40% with an apparatus of the invention.

It will be apparent that various modifications and/or additions may be made in the apparatus of the invention without departing from the essential feature of novelty involved, which are intended to be defined and secured by the appended claims.

What is claimed is:

1. A method for equipping printed circuit boards (5) with components (3) using an equipping apparatus having a rotatable equpping head with a plurality of pickup tools, comprising the steps of:
    collecting components (3) from delivery units (4) by means of said equipping head;
    subsequently equipping a printed circuit board (5) with these components (3);
    said delivery units (4) and said printed circuit board (5) being stationary at different locations;
    moving said equipping head to locations adjacent said delivery units and adjacent said circuit board at the time of collecting or equipping, respectively;
    providing at least one processing station adjacent said equipping head;
    rotating said head to provide a clocked passage of said components past said at least one processing station;
    and processing said components which are collected while they are in position on said multiple equipping head by use of said at least one processing station when said multiple equipping head has been rotated to bring said components into association with said one or more processing stations 8.

2. The method according to claim 1, including the step of simultaneously executing the collecting of components (3) and the equipping of said printed circuit board.

3. The method accoding to one of the claim 1, including the step of coding the components so that they are identifiable at every location of the apparatus.

4. The method according to one of the claim 1, including the step of executing the individual method steps by means of a freely programmable control.

5. Apparatus for equipping printed circuit boards (5) with components (3), particularly in automatic SMD equipping units, comprising, in combination;
    at least one rotatable multiple equipping head (1) having a plurality of pick-up tools for components (3);
    at least one annular device carrier (7) arranged around said multiple equipping head (1) and having processing stations (8) secured thereto;
    means for mounting one or more of said multiple equipping heads (1) on a carriage (6), whereby the multiple equipping head (1) together with the apperatining device carrier (7) are displaceable and positionable in X and Y directions.

6. Apparatus according to claim 5, wherein at least two individually displaceable multiple equipping heads (1) are mounted side-by-side on a common stand (9).

7. Apparatus according to claim 5, wherein at least two multiple equipping heads (1) are disposed lying opposite one another and displaceable on different stands (9).

* * * * *